US012686920B2

(12) United States Patent
Spee

(10) Patent No.: US 12,686,920 B2
(45) Date of Patent: Jul. 21, 2026

(54) ROLL-TO-ROLL PROCESSING

(71) Applicant: KALPANA TECHNOLOGIES B.V., Rotterdam (NL)

(72) Inventor: Diederick Adrianus Spee, Rotterdam (NL)

(73) Assignee: KALPANA TECHNOLOGIES B.V., Rotterdam (NL)

( * ) Notice: Subject to any disclaimer, the term of this patent is extended or adjusted under 35 U.S.C. 154(b) by 400 days.

(21) Appl. No.: 18/256,358

(22) PCT Filed: Dec. 8, 2021

(86) PCT No.: PCT/NL2021/050749
§ 371 (c)(1),
(2) Date: Jun. 7, 2023

(87) PCT Pub. No.: WO2022/124897
PCT Pub. Date: Jun. 16, 2022

(65) Prior Publication Data
US 2024/0018653 A1      Jan. 18, 2024

(30) Foreign Application Priority Data

Dec. 8, 2020    (NL) ...................................... 2027074

(51) Int. Cl.
*C23C 16/455*          (2006.01)
*C23C 16/458*          (2006.01)
*C23C 16/54*           (2006.01)

(52) U.S. Cl.
CPC .. *C23C 16/45551* (2013.01); *C23C 16/45574* (2013.01); *C23C 16/458* (2013.01); *C23C 16/545* (2013.01)

(58) Field of Classification Search
None
See application file for complete search history.

(56) References Cited

U.S. PATENT DOCUMENTS

2005/0172897 A1    8/2005  Jansen
2008/0166880 A1    7/2008  Levy
(Continued)

FOREIGN PATENT DOCUMENTS

CN        103436852 A    12/2013
JP        2005133165 A    5/2005
(Continued)

OTHER PUBLICATIONS

Frijters et al. "Atmospheric Spatial Atomic-layer-deposition of Zn (O, S) Buffer Layer for Flexible Cu (In, Ga) Se2 Solar Cells: From Lab-scale to Large Area Roll to Roll Processing", 2016 IEEE 43rd Photovoltaic Specialists Conference (PVSC), Jun. 5, 2016, pp. 1449-1451.

(Continued)

*Primary Examiner* — Jason Berman
(74) *Attorney, Agent, or Firm* — Steven M. Koehler; Westman, Champlin & Koehler, P.A.

(57)          ABSTRACT

A system for roll-to-roll deposition is described wherein the system comprises a substrate transport system comprising a static elongated central cylinder for helical transport of a flexible substrate arranged around the cylinder, the cylinder comprising bearing structures arranged in or arranged on the surface of the cylinder for frictionless or low-friction transport of the flexible substrate over the surface of the central cylinder; and, one or more atomic layer deposition ALD deposition heads, an ALD deposition head being configured as a hollow cylinder, the inner surface of a processing head including deposition structures for depositing atomic layers onto the flexible substrate; wherein the inner radius of a deposition head is larger than the outer radius of the central cylinder, the one or more deposition heads being configured to rotate around the central cylinder, wherein the longitudi- (Continued)

nal axis of a processing head coincides with the longitudinal axis of the central cylinder.

19 Claims, 11 Drawing Sheets

(56) References Cited

U.S. PATENT DOCUMENTS

| | | | | |
|---|---|---|---|---|
| 2014/0147592 A1* | 5/2014 | Hart | .......................... | B01J 19/22 |
| | | | | 427/372.2 |
| 2014/0186527 A1* | 7/2014 | Teo | ........................ | C23C 16/545 |
| | | | | 427/177 |
| 2015/0333289 A1* | 11/2015 | Yamada | ................. | C23C 16/458 |
| | | | | 118/723 R |
| 2015/0376785 A1 | 12/2015 | Knaapen et al. | | |
| 2018/0037994 A1 | 2/2018 | Vermeer et al. | | |

FOREIGN PATENT DOCUMENTS

| | | |
|---|---|---|
| WO | 2012028776 A1 | 3/2012 |
| WO | 2018228683 A1 | 12/2018 |

OTHER PUBLICATIONS

Poodt et al. "Low Temperature and Roll-to-roll Spatial Atomic Layer Deposition for Flexible Electronics", Journal of Vacuum Science and Technology: Part A, Jan. 1, 2012, pp. 01A142-1-01A142-5, vol. 30, No. 1.

Poodt et al. "Spatial Atomic Layer Deposition: A Route Towards Further Industrialization of Atomic Layer Deposition", Journal of Vacuum Science & Technology: Part A, pp. 010802-1-010802-11, vol. 30, No. 1.

International Search Report and Written Opinion in corresponding International application No. PCT/NL2021/050749 dated Mar. 7, 2022.

* cited by examiner

ROLL-TO-ROLL PROCESSING

CROSS-REFERENCE TO RELATED APPLICATION(S)

The present application is a § 371 national phase entry of International patent application Serial No. PCT/NL2021/050749, filed Dec. 8, 2021, and published in English, and claims priority from Netherlands application no. 2027074 filed on Dec. 8, 2020.

FIELD OF THE INVENTION

The invention relates to roll-to-roll processing, and in particular, though not exclusively, to a roll-to-roll processing system such as a roll-to-roll layer deposition system and a substrate transport mechanism for such a roll-to-roll layer processing system.

BACKGROUND OF THE INVENTION

Roll-to-roll processing (also known as web processing or reel-to-reel processing) includes methods wherein thin-films structures for e.g. displays, photovoltaics or battery electrodes are deposited, etched and processed on a roll of flexible plastic substrate or a metal foil in a continuous way. Currently, roll-to-roll processing techniques are developed that allow control of the process at atomic level with high throughput. For example, atomic layer deposition (ALD) is a thin-film deposition process wherein a surface of a substrate is sequentially coated with an inorganic material by exposing it to two, or more, alternating precursor gases to deposit a thin-film material. These gases react with the surface such that a perfect monolayer of the material is formed on the substrate. This process is self-limiting in the sense that the reaction stops once the precursor gases have been transformed into the monolayer coating and provides a highly conformal coating. This way, ALD allows the formation of high-quality coatings and became a preferable method for many applications in the semiconductor industry, e.g. photovoltaics, battery electrodes, OLED's etc.

In conventional ALD processing schemes deposition speeds are very slow because every half-cycle the reaction chamber has to be evacuated, which makes the process less suitable for large scale applications. To that end, spatial ALD schemes have been developed wherein precursors are deposited continuously but in different physical locations. An overview of spatial ALD techniques is described in the article by Poodt et al, *Spatial atomic layer deposition: a route towards further industrialisation of atomic layer deposition.*, J. Vac. Sci. Technol. A30(1), February 2012. The spatial ALD concept can also be used in a roll-to-roll system for layer deposition on flexible substrates. In that case separation of gasses is challenging, as in a roll-to-roll system accurate control of the substrate is very difficult. Various schemes have been developed to address this problem.

US2018/0037994 describes a spatial roll-to-roll ALD system wherein a flexible substrate is guided around a rotating drum, which is configured as a deposition head. During deposition, the web is transported contactless over the rotating drum using gas bearings. Similarly, WO2012028776 describes a system wherein the substrate is tightly wrapped around a central cylindrical configuration of bearing devices, while a deposition head is moving on the outside.

For both schemes it is very difficult to control the substrate position all around the tool. Transport of the substrate with high accuracy is extremely important since the substrate is confining the gases in their own slots. Moreover, in both schemes there is an area where the deposition head is not covered by the substrate. Gases can flow out here uncontrolled. To avoid this, the deposition head must (at least partly) be purged before it enters this zone. Such measure will be at the cost of throughput, since the flushing/purging needs to start sometime before, so a large part of the deposition area is lost. Moreover, purging will never be perfect, resulting in gas phase reactions in this area, i.e. contamination.

Hence from the above, it follows that there is a need in the art for an improved roll to roll layer processing system. In particular, there is a need in the art for a roll-to-roll processing system, such as a roll-to-roll layer deposition system that is suitable for deposition techniques, such as ALD techniques, that require accurate positional control of the substrate relative to the deposition head. In particular, there is a need in the art of an improved substrate transportation system for roll-to-roll processing, that allows for complete coverage of the deposition head with the substrate at all times.

SUMMARY OF THE INVENTION

As will be appreciated by one skilled in the art, aspects of the present invention may be embodied as a system or a method.

The invention aims to provide an improved roll-to-roll deposition system and substrate transport system for such a deposition system that allows, during deposition, for accurate control of the substrate relative to the deposition head. The deposition system is especially suitable for high speed or high throughput roll-to-roll spatial ALD processing. Considering that in industrial processes substrates can be several meters wide and 10-200 micrometres thick, they are usually very flexible and it is complex to control their exact position. In many deposition processes it is of utmost importance to accurately control the distance between deposition head and substrate. Especially in spatial ALD deposition, where one needs distances between substrate and deposition head of 200 micrometres or less, preferable 50 micrometres or less, to ensure adequate gas confinement.

In an aspect, the invention may relate to a system for roll-to-roll processing, comprising: a substrate transport system comprising a static elongated central cylinder for helical transport of a flexible substrate arranged around the central cylinder, the central cylinder comprising bearing structures arranged in or arranged on the surface of the central cylinder for frictionless or low-friction transport of the flexible substrate over the surface of the central cylinder; one or more ALD deposition heads, an ALD deposition head being configured as a hollow cylinder, the inner surface of a processing head including deposition structures for depositing atomic layers onto the flexible substrate; wherein the inner radius of a deposition head is larger than the outer radius of the central cylinder, the one or more deposition heads being configured to rotate around the central cylinder, wherein the longitudinal axis of a processing head coinciding with the longitudinal axis of the central cylinder.

In an embodiment, the space between the surface of the central cylinder and the inner surface of a deposition head form deposition zones for depositing atomic layers onto the flexible substrate while the substrate is transported via a first helical path around the central cylinder through the deposition head.

The helical transport system in a spatial ALD system with a rotating deposition head provides various advantages over the prior art including that fact that: the deposition head is continuously facing the web so that efficient deposition can be achieved; that during deposition, the deposition head rotates thereby increasing the number of ALD cycles (one ALD cycle forming one atomic layer) the substrate is exposed to while travelling through the deposition area; and, that the gas bearing central cylinder allows stable and accurate definition of the radial position of the substrate over the entire deposition area. This provides good separation of precursor gasses in the deposition area.

In one aspect, the invention may relate to a roll-to-roll processing system comprising: a substrate transport system comprising an elongated central cylinder for helical transport of a flexible substrate wrapped around the central cylinder; a processing head configured as a hollow cylinder, the inner surface of the deposition head including processing structures, e.g. precursor gas outlets, for depositing one or more substances onto the surface of the flexible substrate; the inner radius of the processing head being larger than the outer radius of the central cylinder, the central cylinder being positioned inside the hollow first deposition head, the longitudinal axis of the processing head coinciding with the longitudinal axis of the central cylinder, the space between the surface of the central cylinder and the inner surface of the processing head defining a processing zones; the substrate transport system being configured to transport the flexible substrate via a first helical path around the central cylinder through the processing head, and the processing head being configured to rotate around the central cylinder.

Hence, the invention includes a processing head that moves relative to a flexible substrate, e.g. a web or a foil, that is transported via a helical path around a cylindrical central cylinder through the processing head.

This way, all positions of the substrate can be exposed to many precursor cycles (different precursor gases) as fast as possible. Further, compared to prior art solutions, the invention provides improved gas confinement so that precursors do not mix thereby avoiding gas phase reactions, contamination of the system (processing chamber) or the substrate and dust/particle formation. Additionally, the invention eliminates, or at least minimizes, the risk that a deposited coating may contact surfaces of the deposition system, thereby avoiding possible damage of the coating or particle formation in or on the coating.

An important process advantage the proposed roll-to-toll processing system brings is that the complete deposition head is always covered by the substrate. Hence there are never uncovered slots, where gas leakages and contamination can occur. Additionally, there is no need to purge gas slots before they are entering an area where they are uncovered, increasing the deposition area/efficiency significantly. The continuous control of the substrate position, at all times, enables good gas confinement without the risk of touching the substrate. Since there are no points of in- or out feed of the substrate facing the deposition area, no disturbance of deposition conditions will occur anywhere.

A further benefit of the invention regards the possibility to choose the start or finishing precursor in a deposition sequence such as an ALD deposition sequence. In known spatial ALD processes, the sequence of precursors for every part of the substrate starts or finishes with another (random) one of the precursors. In contrast, the invention allows selection of one or more predetermined precursors for starting or finishing the process, thus adding new deposition possibilities to existing processes. For example, in some deposition schemes, it may be desired to start the deposition process always with a metal precursor (as opposed to an oxidizer) to ensure homogeneous nucleation of the ALD growth on the substrate (for instance always start aluminiumoxide growth with a trimethylaluminium exposure). In other deposition schemes, it might be beneficial to be able to choose a finishing precursor (for instance passivate an organic layer which is unstable in the environment, deposited through molecular layer deposition, by always finishing with a metal precursor, or even a sequence of cycles to cap it with a thin inorganic layer.

In an embodiment, the helical transport of the substrate is associated with a first rotation direction and the rotation of the first deposition head is associated with a second rotation direction, the second rotation direction being opposite to the first rotation direction.

In an embodiment, the central cylinder comprises bearing structures, preferably gas bearing structures and/or roller bearing structures, arranged in or on the surface of the central cylinder, for providing frictionless or low-friction transport of the flexible substrate through the first deposition chamber.

In an embodiment, the substrate transport system further includes: a plurality of hollow tube segments arranged next to each other over the central cylinder, the flexible substrate being wrapped around the hollow tube segments, wherein, when the flexible substrate is transported through the first deposition chamber, the tube segments move over the central cylinder towards the end of the central cylinder.

In an embodiment, the substrate transport system further includes: a flexible belt, preferably an endless conveyer belt, configured to move around the cylindrical central cylinder via a second helical path, the flexible belt forming a helical belt transport structure for the flexible substrate, the flexible substrate being wrapped around the helical belt transport structure, wherein when the flexible belt structure is transported over the central cylinder via the second helical path, the flexible substrate being transported via the first helical path through the processing chamber.

In an embodiment, the substrate transport system further comprises: a transport guiding structure for guiding the flexible substrate onto the central cylinder, the guiding structure being arranged so that the flexible substrate follows the first helical path around the central cylinder.

In an embodiment, the deposition structures are arranged in a plurality of processing zones, each processing zone extending in the axial direction in the inner surface of the processing head, each processing zone including processing structures for processing, e.g. depositing a material onto the substrate.

In an embodiment, each of the plurality of processing zones may be separated by purging zones and/or exhaust zones.

In an embodiment, the processing structures may include one or more deposition structures configured to deposit one or more layers onto the substrate based on a chemical vapor deposition technique, such as plasma enhanced chemical vapour deposition (PECVD), hot wire chemical vapour deposition (HWCVD) or metal organic chemical vapour deposition (MOCVD), based on atomic layer deposition (ALD), molecular layer deposition (MLD), a physical vapour deposition (PVD) technique or a printing technique, such as slot die coating, or inktjet printing.

In a further aspect, the invention may relate to a substrate transport system for a roll-to-roll processing system comprising: an elongated static central cylinder for helical transport of a flexible substrate wrapped around the central cylinder; the central cylinder comprising bearing structures, preferably gas bearing structures and/or roller bearing structures, arranged in or on the surface of the central cylinder, for providing frictionless or low-friction transport of the flexible substrate; and, a transport guiding structure for guiding the flexible substrate onto the central cylinder, the guiding structure being arranged so that the flexible substrate follows the first helical path around the central cylinder.

The system allows continuous un-interrupted frictionless transport of the substrate through the processing head.

In an embodiment, the substrate transport system further comprises: a plurality of hollow tube segments arranged next to each other over the central cylinder, the flexible substrate being wrapped around the hollow tube segments, wherein when the flexible substrate is transported through the processing chamber, the tube segments move over the central cylinder towards the end of the central cylinder.

In an embodiment, the substrate transport system further comprises: a flexible belt, preferably an endless conveyer belt, configured to move around the cylindrical central cylinder via a second helical path, the flexible belt forming a helical belt transport structure for the flexible substrate, the flexible substrate being wrapped around the helical belt transport structure, wherein when the flexible belt structure is transported over the central cylinder via the second helical path, the flexible substrate is being transported via the first helical path through the processing chamber.

An important process advantage of the proposed transport system, compared to state of the art roll-to-roll transport systems, is that the transport cylinder is in permanent contact with the substrate. This close contact enables an accurate control of the substrate temperature through cooling or heating the transport cylinder itself, even when used in a vacuum environment. Additionally, since the substrate is at all points tightly wrapped around the central cylinder, chances of deformation (for instance wrinkling due to heating/cooling of the substrate) are minimized.

Furthermore, the permanent support of the substrate enables the use of very thin and fragile substrates, which is very desirable, yet virtually impossible in many state of the art roll-to-roll tools and processes.

The proposed transport cylinder as the central component of a production line processing flexible substrates is convenient for applying multiple processes (CVD, ALD, slot die coating, curing, etc. in one system, since the substrate never has to leave the central cylinder.

Since no steering units/additional rollers between processes are needed, the footprint of the complete tool/line can be very small.

The configuration of processing equipment, such as deposition equipment, placed next to each other facing the central transport cylinder, makes all equipment easily accessible for maintenance, repair or cleaning. As opposite to a state-of-the art production line where all process equipment is placed after one another in the center of the line.

An important practical advantage of the transport system, especially in a research and development situation, is that one system can be used to process a variety of substrate widths. By adjusting the angle at which the substrate enters the central cylinder, the pitch of the first helical path can be chosen to match the substrate width.

The invention will be further illustrated with reference to the attached drawings which schematically will show embodiments of the invention. It will be understood that the invention is not in any way restricted to these specific embodiments.

A BRIEF DESCRIPTION OF THE DRAWINGS

DETAILED DESCRIPTION

Figure 1A:
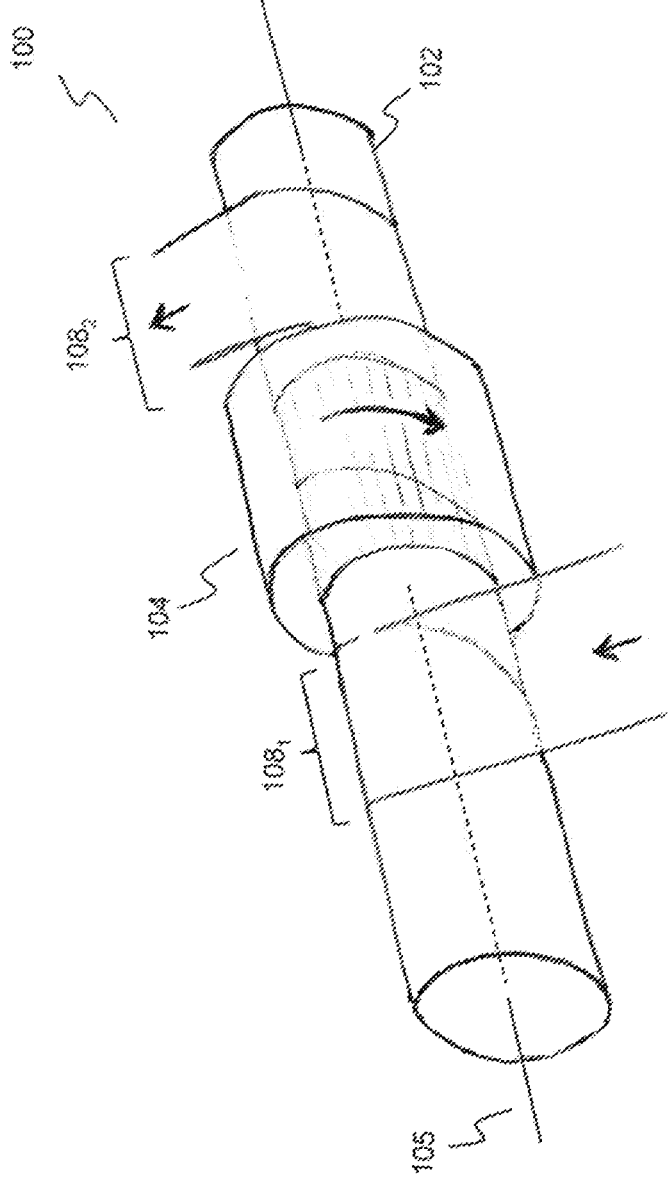
FIG. 1A-1C depicts a schematic of a roll-to-roll layer deposition system according to an embodiment of the invention.
Figures 1B, 1C:
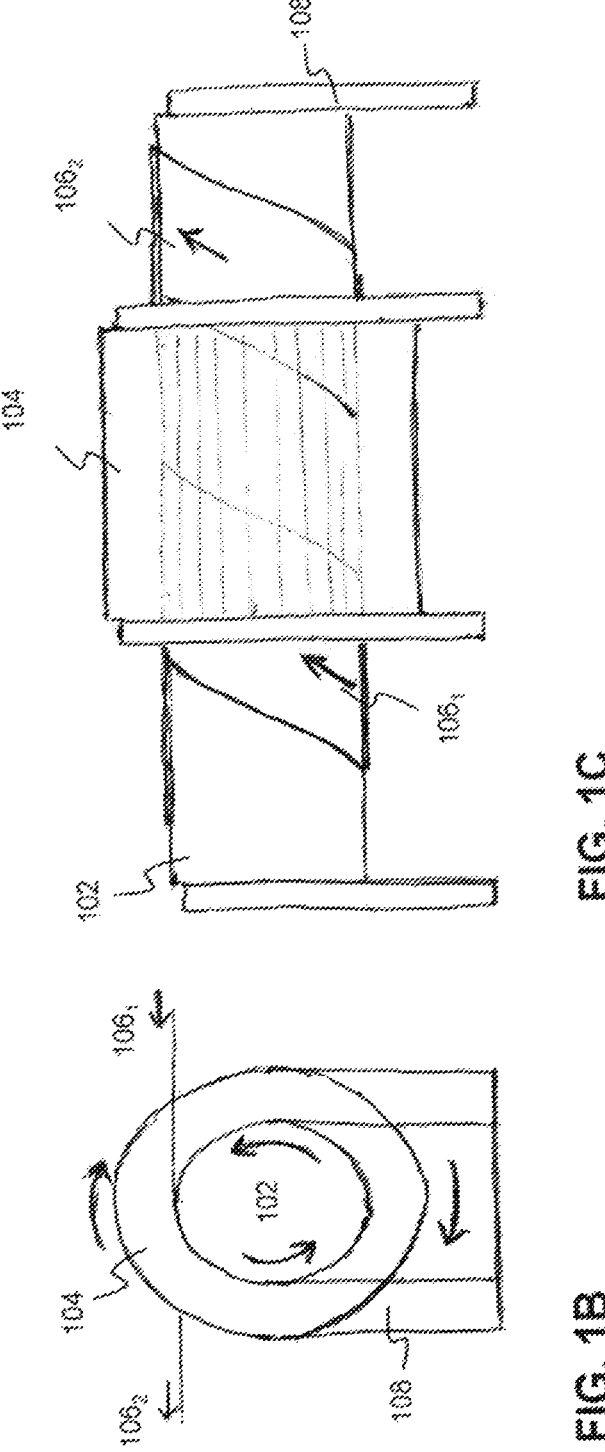

FIG. 1A-1C depicts a schematic of a roll-to-roll processing system according to an embodiment of the invention. In particular, FIG. 1A illustrates a schematic of a roll-to-roll layer processing system 100, e.g. a roll-to-roll deposition system, including an elongated static central cylinder 102 that has a bearing surface to receive an elongated flexible substrate 106, also known in the art as a web or a foil. The web material may be a metal, e.g. stainless steel, or an organic material, while the web width can be as small as a few centimetres up to two meters or more, having a thickness between 10 and 200 micrometres.

FIG. 1B and FIG. 1C depict two different side views of the system (parallel to the longitudinal axis 105 and perpendicular to the longitudinal axis of the central cylinder respectively). The system may be configured to wrap the web around the central cylinder in a helical manner so that during transportation the flexible substrate will follow a helical path over the central cylinder. Further, the system may comprise a processing head 104, which is configured as a hollow cylinder, wherein the inner radius of the hollow cylinder is larger than the radius of the central cylinder. Further, during deposition, the cylindrical deposition head may be configured to rotate around the central cylinder.

As shown in the figure, the central cylinder may be positioned inside the hollow cylindrical processing head so that the longitudinal axis of the hollow cylinder coincides with the longitudinal axis of the central cylinder. The inner surface of the hollow cylinder may include processing structures, e.g. deposition structures, pre-treatment structures and/or etching structures, that directly face the outer surface of the substrate that is arranged around the central cylinder. The helical path allows the in-feed area $108_1$ and the out-feed area $108_2$ of the substrate to be located outside the deposition head. As the central cylinder is configured to allow the flexible substrate to move along a helical path through the deposition head, web positions at all points within the deposition head are clearly defined so a continuous layer can be deposited while problems related to prior art systems do not arise. The processing head is always facing (covered by) the substrate at any time during the deposition, since the in-feed area and out feed area of the web are outside the drum. No purging or flushing of the processing head is needed. The web may be tightly wrapped around the inner cylinder so that accurate control of the distance between the inner surface of the processing head and the surface of the substrate is possible. This way, this distance can be made very small, e.g. between 50 and 200 micrometre, thus avoiding cross over of gases without risking touching the substrate. The system thus provides a high deposition rates while eliminating the risk of contamination.

The helical path of the web through the processing head may be realized in various ways. For example, in an embodiment, the central cylinder may be configured to allow frictionless transportation of the substrate over the central cylinder. Hence, in that case, the rotating drum may include gas bearing structure including a plurality of holes or a porous layer in the surface of the rotating drum for releasing gas at a certain pressure so that when a substrate is wrapped around the rotating drum, the gas forms a spacing between the surface of the rotating drum and a first (back) surface of the substrate.

Figure 2A:
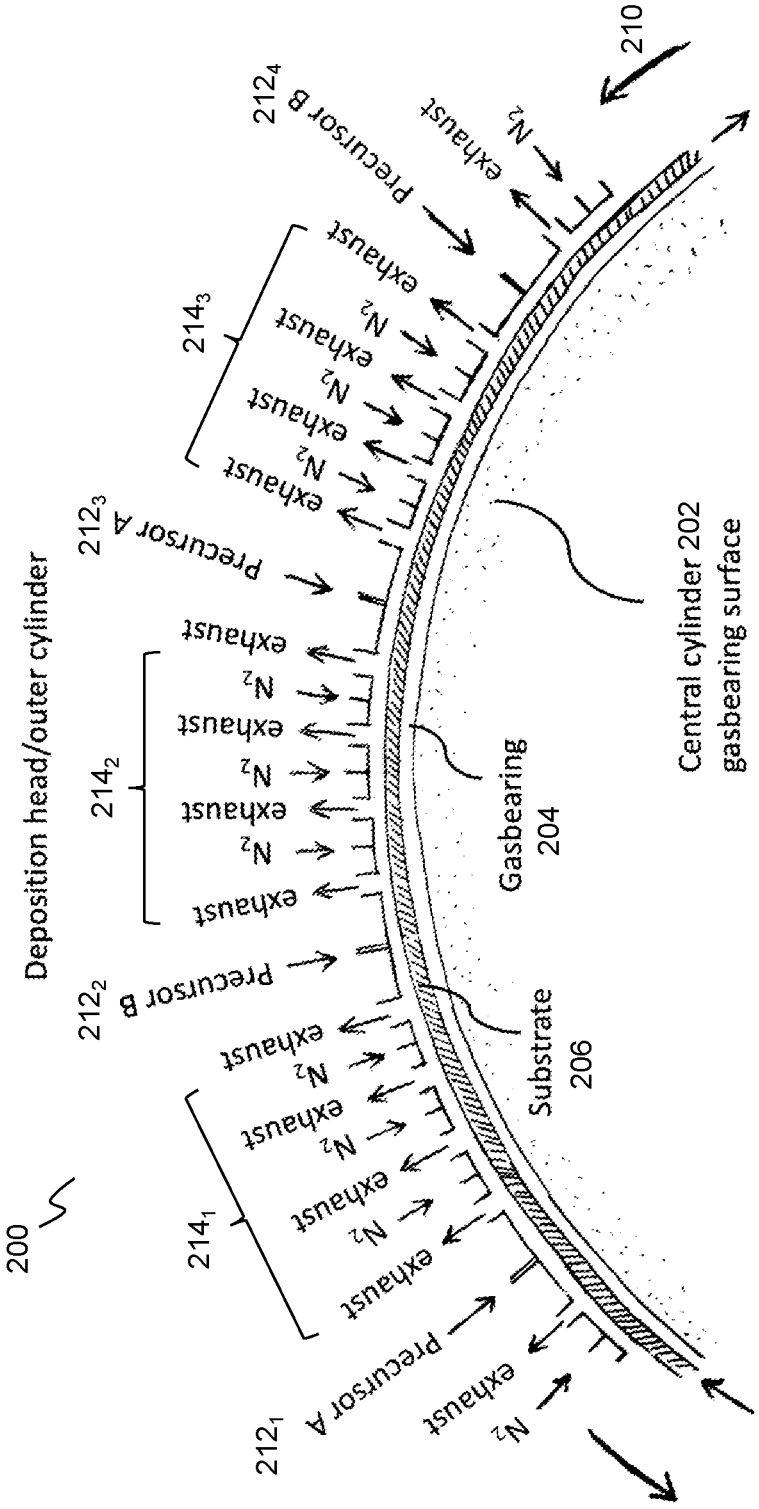
FIG. 2A-2C depict schematics of cross-sections of roll-to-roll layer deposition systems according to various embodiments of the invention.
Figures 2B, 2C:
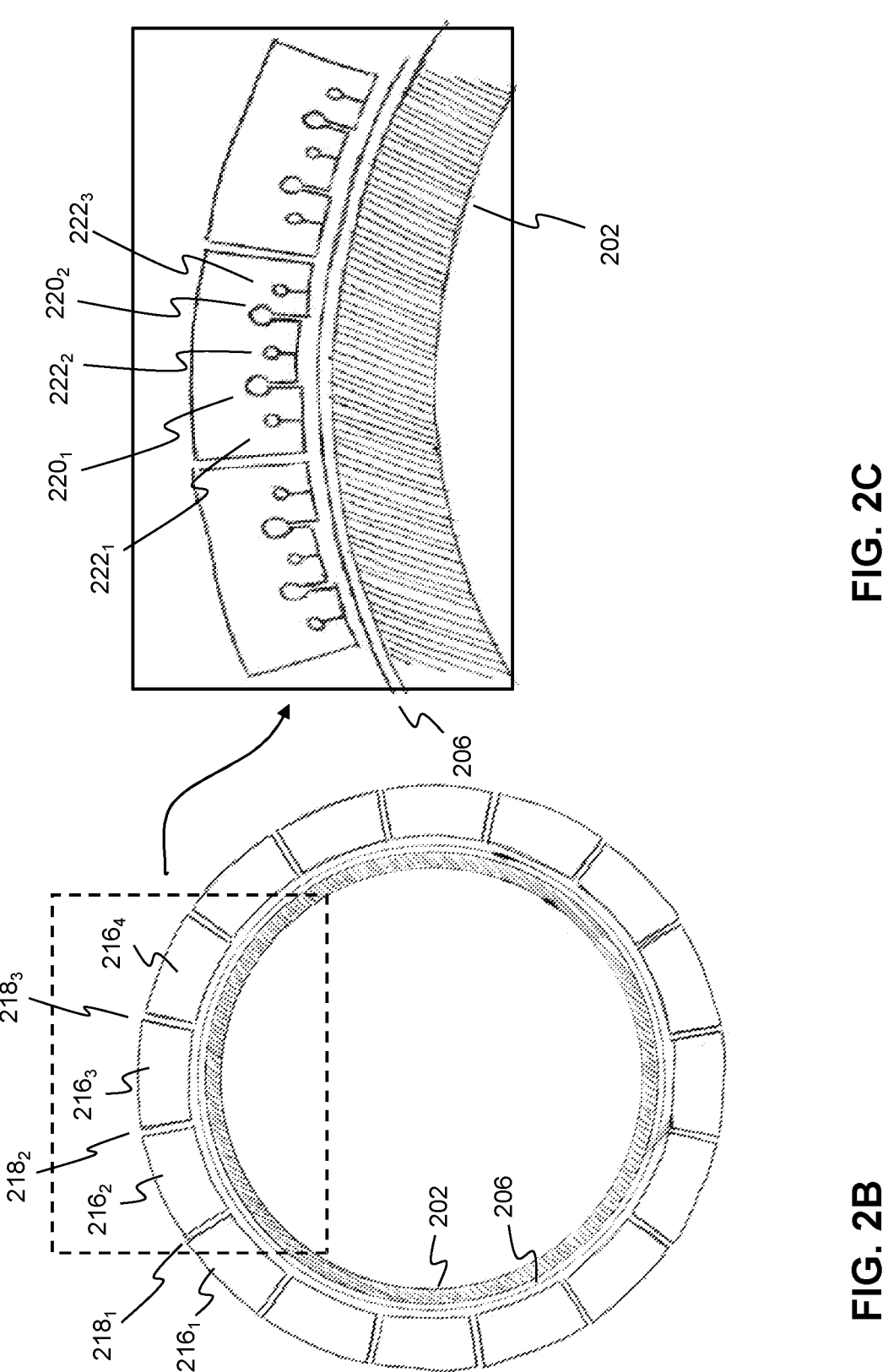

FIG. 2A-2C depict schematics of cross-sections of roll-to-roll layer deposition systems according to various embodiments of the invention. In particular, FIG. 2A depicts a cross-section of a roll-to-roll processing system according to an embodiment of the invention. In particular, this figure depicts a non-limiting example of a roll-to-roll atomic layer deposition layer (ALD) system $200$. The system may include a central cylinder $202$ comprising a gas bearing surface $204$. The gas bearing may be realized by gas outlet structures, e.g. nitrogen gas, in the outer surface of central cylinder. Further, the central cylinder is positioned within a hollow cylindrical deposition head $210$. The outer diameter of the central cylinder and the inner diameter of the hollow cylinder of the deposition head are dimensioned to form a cylindrical space, which may be referred to as the deposition chamber.

The deposition chamber may be configured to receive and position a web $206$, wherein the distance between the outer surface of the central cylinder and the back surface of the substrate may be controlled by controlling the pressure within the deposition chamber at both surface sides of the web. A transport mechanism, including a web guiding system (described below in more detail with reference to FIGS. $6$ and $7$) may be used to transport the web through the deposition chamber. As shown in the figure, during transportation the top surface may face the inner surface of the deposition head. The cylindrically shaped deposition head may be divided in functional sections, including one or more deposition structures $212_{1-4}$, for example sections including precursor outlets. Each precursor section may be configured to expose part of the substrate to a precursor gas so that it can react with the substrate. The deposition head may rotate around its axis in a first tangential direction $210$, while the web is transported through the deposition chamber wherein the helical transport direction includes a second tangential direction $208$ that is opposite to the first tangential direction.

Thus, when the web is transported with a certain velocity through the deposition chamber while the deposition head is moving over the substrate, a precursor gas is exposed to the substrate at each precursor section. The deposition head may include deposition sections $212_{1-4}$ including deposition structures such as precursor outlets. The deposition structures of the deposition head may be separated by buffer sections $214_{1-3}$, which may include nitrogen inlets and outlets (exhaust openings) so that gas can be evacuated. Feeding gasses to the rotating deposition head and extracting gasses from the rotating deposition head may be realized with use of a rotary union or a rotary joint, which are well known union structures that allow supply media (gas, liquid) from a fixed (static) part into a rotating part. It provides a seal between a stationary supply passage (such as pipe or tubing) and a rotating part (such as a drum, cylinder, or spindle) to permit the flow of a fluid or gas into and/or out of the rotating part. In some embodiment, the supply of gas to the deposition head may be realized by one or more hollow shaft rotary unions which are positioned around the central transport cylinder on one or both sides of the deposition head.

During deposition, the nitrogen may be introduced in the deposition chamber at the location of a buffer section. This way, in the space between the web and the deposition head deposition zones (comprising one or more precursor gases) may be formed that are separated by buffer zones (comprising nitrogen gas). The buffers zones may for example prevent cross-contamination between different precursors of different precursor sections. The zones allow accurate control of the precursor reactions with the substrate in each precursor section. Controlling the pressure of the gas bearing and the pressure of the buffer zones and deposition structures allows the web to be "suspended" at a predetermined position within the deposition chamber. This way, the web can be transported frictionless or at least with low friction through the deposition chamber while at every precursor section a layer is deposited onto the web.

FIG. 2B and 2C depict further cross-sections of a roll-to-roll atomic layer deposition layer (ALD) system including a central cylinder $202$ comprising a web $206$ positioned between gas bearing surface $204$ of the central cylinder. The deposition head deposition head may include a plurality of radially arranged deposition modules $216$, so that during deposition the surface of the web is always facing a deposition module. Between the deposition modules gas outlets (exhausts) may be positioned. As shown in FIG. 2C, a deposition module may include one or more outlets $220_{1,2}$ for one or more precursors and outlets for gas, e.g. nitrogen, to form buffer zones. This figure shows that the inner surface of the deposition head, comprising the deposition modules, is located close to the web.

FIGS. $1$ and $2$ clearly illustrate the advantages of the helical web transport system in a spatial ALD system with a rotating deposition head which may include: the deposition head is continuously facing the web so that efficient deposition can be achieved. Further, during deposition, the deposition head rotates thereby increasing the number of ALD cycles the substrate is exposed to while travelling through the deposition area. Additionally, the gas bearing central cylinder allows stable and accurate definition of the radial position of the substrate over the entire deposition area. This is necessary to ensure good separation of precursor gasses in the deposition area.

Figure 3:
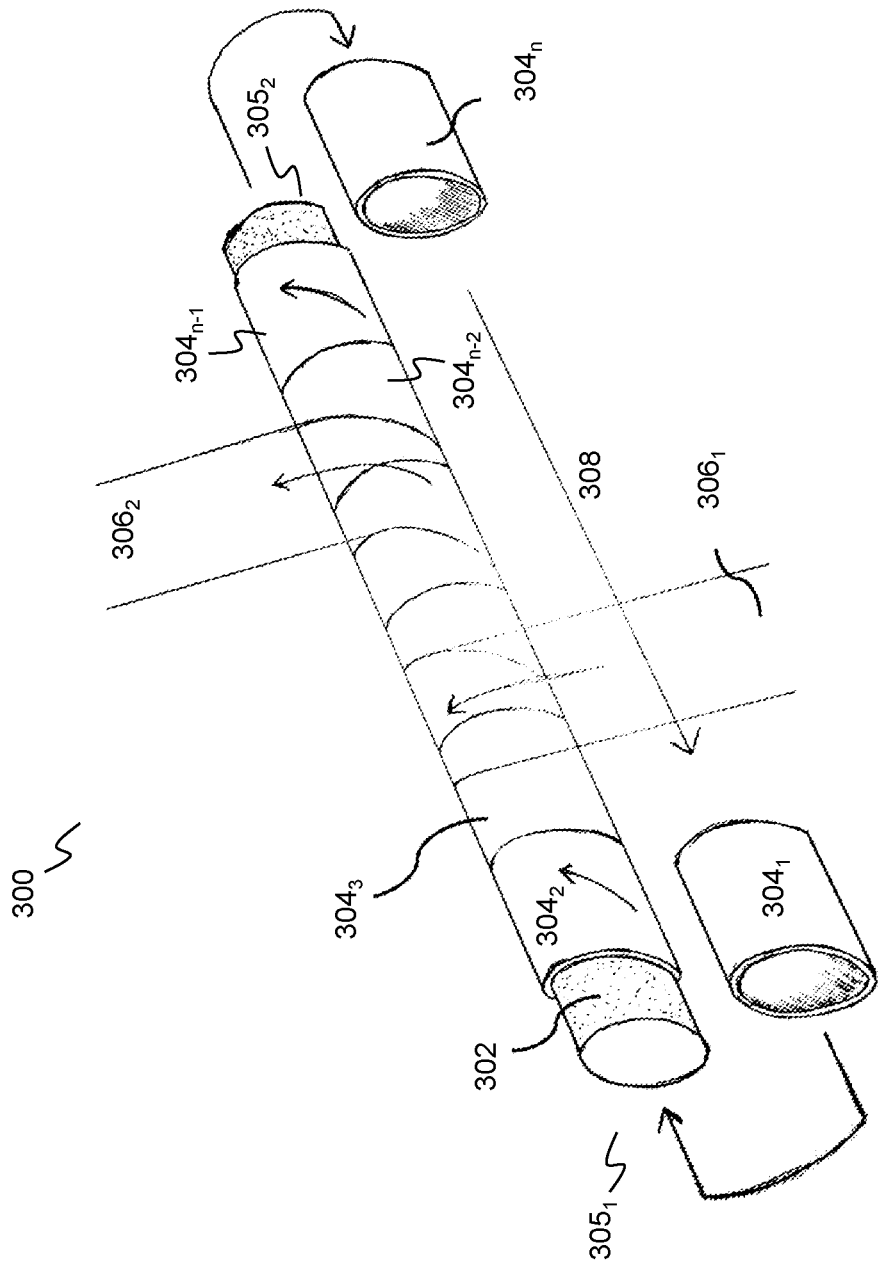
FIG. 3 depicts a schematic of a substrate transportation system for roll-to-roll deposition according to an embodiment of the invention.

FIG. 3 depicts a schematic of part of a substrate transport system according to an embodiment of the invention. In particular, the figure depicts a substrate transport system $300$ comprising a static central cylinder $302$ comprising, a first end $305_1$, a second end $305_2$ and a bearing surface, preferably a low-friction or frictionless bearing surface, e.g. a gas bearing surface. Further, tube segments $304_{1-n}$ in the shape of hollow cylinders that have an inner diameter that is slightly larger than the outer diameter of the central cylinder. For example, when the tube segments slide over the central cylinder, a small spacing between the outer surface of the central cylinder and the inner surface of the tube segments may form a gas bearing structure that allow substantially frictionless movement of the tube segments over the central cylinder. The tube segments may be arranged next to each other over the central cylinder to from a smooth surface for receiving the web. A web guiding structure (as e.g. described below with reference to FIG. 6) may be used to tightly wrap the web $306_{1,2}$ around the surface formed by the central cylinder segments in a helical manner. The substrate transport system may be used in a roll-to-roll processing system as described with reference to FIG. 1.

Hence, in contrast to the substrate transportation cylinder of FIG. 2 wherein a static central cylinder with a bearing structure, e.g. a gas bearing structure, may keep the web at a certain position ("suspended") within the deposition chamber, in this embodiment the web is in direct contact with the tube segments which move over the bearing surface of the central cylinder. Direct contact provides accurate control of positioning and transportation of the web. Additionally, the direct contact of the web with the tube segments allows improved temperature control of the web, which is an important process parameter in the deposition process.

As the position of the central cylinder and the web guiding structure is static, the tube segments will move from the first end $305_1$, over the central cylinder towards the second end $305_2$ of the cylinder. In other words, the segments will follow an identical helical pattern as the web that is transported over the helical path through the deposition head, towards the end of the central cylinder as depicted in the figure. The segments will either be pulled by the web itself, or be transported by an additional driving element. At the end of the central cylinder a transport mechanism may be used to transport the tub elements back to the start of the cylinder. This way, continuous ("endless") transport of the web through the deposition head can be guaranteed.

Figure 4:
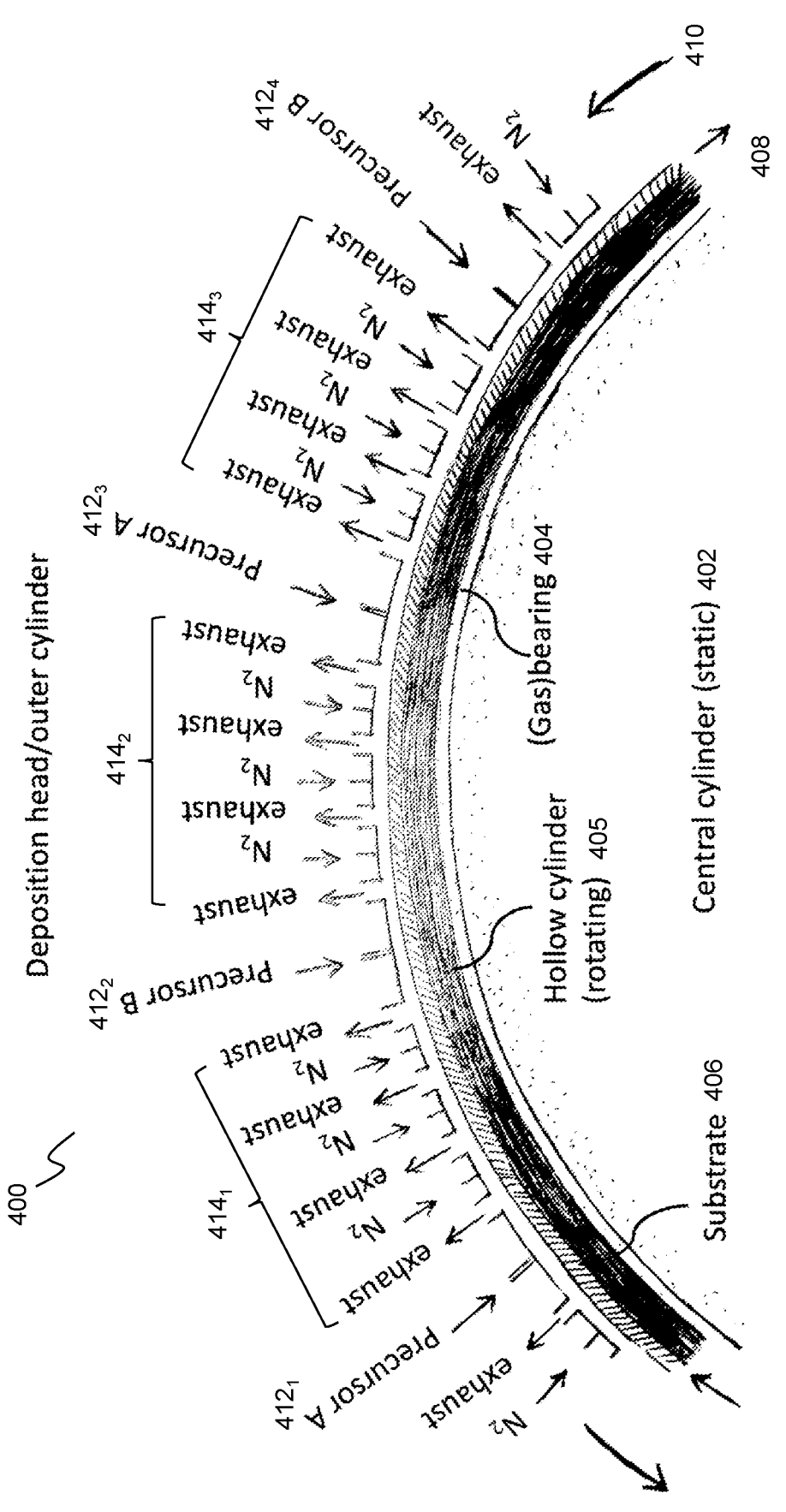
FIG. 4 depicts a schematic of a cross-section of a roll-to-roll layer deposition system according to an embodiment of the invention.

FIG. 4 depicts a schematic of a cross-section of a roll-to-roll layer deposition system according to an embodiment of the invention. In particular, this figure depicts a cross-section of roll-to-roll layer deposition system comprising a substrate (web) transport system as described with reference to FIG. 3. The figure depicts the central (static) cylinder 402 and a hollow tube segment 405 elevated above the surface of the central cylinder based on a bearing structure 404, e.g. a gas bearing structure or a mechanical bearing structure. As described with reference to FIG. 3, a web may be tightly wrapped around the outer surface of the tube segment. When the web is transported over the central cylinder, the tube segment may move (rotate) in one direction relative to the static central cylinder. Further, a deposition head 410 may be positioned around the central cylinder and the tube element and configured to rotate in a direction opposite to the direction of movement of the tube segment that carries the web. The space between the central cylinder and the inner surface of the deposition head may define a deposition chamber wherein the inner surface of the deposition head may include deposition structures $412_{1-4}$, e.g. precursor gas outlets, for depositing one or more substances onto the surface of the flexible substrate. Additionally, the inner surface of the deposition head may include buffer zones $414_{1-3}$, e.g. gas purge zones. During deposition, these buffer zones separate the chemical processes that take place at each deposition structure. As shown in this figure, the web transport mechanism provides accurate positioning of the web with respect to the deposition head during the transport of the web through the deposition chamber.

Figure 5:
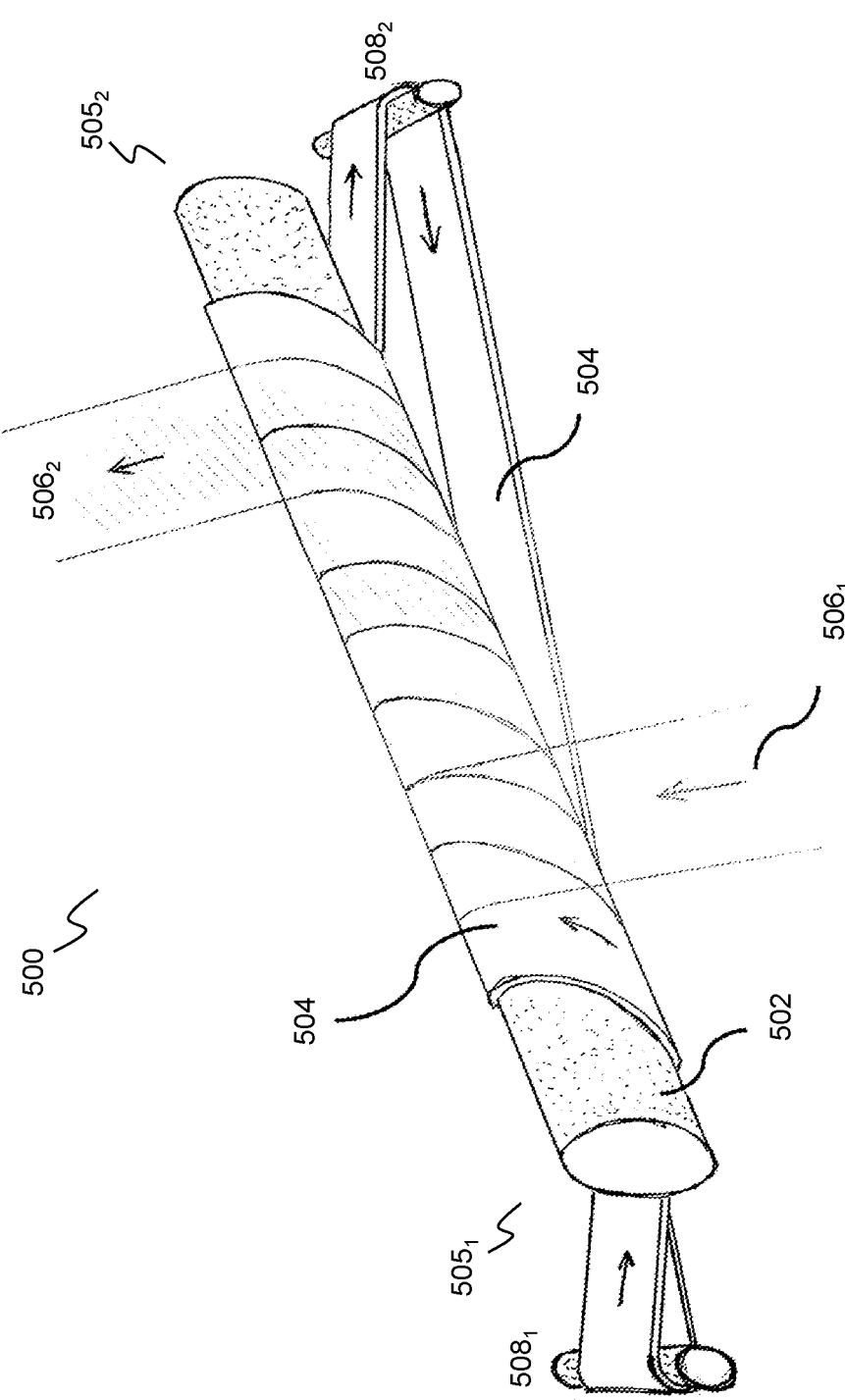
FIG. 5 depicts a schematic of a substrate transportation system for roll-to-roll deposition according to an embodiment of the invention.

FIG. 5 depicts a schematic of a substrate transportation system for roll-to-roll processing system according to an embodiment of the invention. In particular, this figure depicts a central static cylinder 502 comprising a bearing surface. Further, a belt guiding structure may include a roller system including a plurality of rollers $508_{1,2}$ which is configured to guide and transport a (semi) flexible belt 504, e.g. a belt of a suitable (semi) flexible material or a material similar to the material of the web, over the central cylinder in a helical manner. Further, the flexible belt may be guided onto the central cylinder and moves along the central cylinder in a helical manner to form a smooth surface for receiving a web. The belt forms a closed loop thereby creating an "endless" transport surface for a web similar to the embodiment described with reference to FIG. 3. A web guiding structure (as e.g. described below with reference to FIG. 6) may be used to tightly wrap the web $506_{1,2}$ around the surface formed by the semi-flexible belt in a helical manner. The flexible belt may form a second helical path around the central cylinder. Hence, also in this embodiment, the web will be in direct contact with the belt allowing accurate control of the position of the web in the deposition chamber and accurate control of the temperature of the web during deposition.

In this embodiment, the position of the central cylinder, the roller system for guiding the belt and the web guiding system may be static, i.e. at a fixed position, and the web will be tightly wrapped around the smooth surface of the belt. Therefore, once the web is helically transported over the central cylinder, the friction between the web and the belt and/or an additional driving mechanism (e.g. driver rollers), will cause the belt to move over the central cylinder, wherein the roller system will form an endless substrate (web) transportation system for a roll-to-roll processing system as described with reference to the embodiments in this application. The substrate transport system may be used in a roll-to-roll processing system as described with reference to FIG. 1. In that case, the cross-sectional view of the system will be similar to the one described with reference to FIG. 4.

Figure 6:
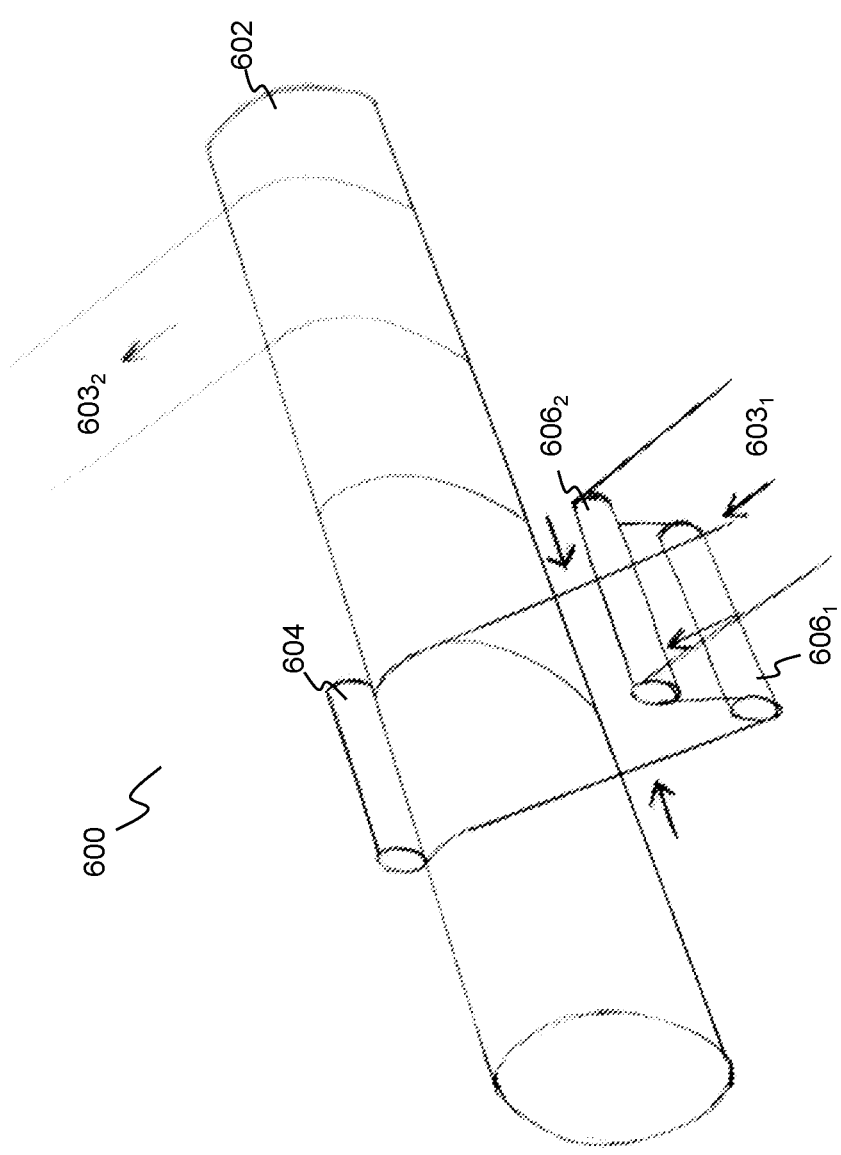
FIG. 6 depicts a substrate guiding structure according to an embodiment of the invention.

FIG. 6 depicts a substrate guiding structure according to an embodiment of the invention. In particular, this figure depicts a first substrate guiding structure 600 for guiding a flexible substrate $603_{1,2}$, onto the central cylinder 602, e.g. onto a bearing surface of the central cylinder or onto a surface formed by central cylinder segments or a helical belt that move over the bearing surface of the central cylinder. A further, second substrate guiding structure (not shown) may be configured to guide the substrate away from the central cylinder. A substrate guiding structure may include one or more mechanical rolls 604, $606_{1,2}$ including one or more first rolls $606_{1,2}$ that may be configured as driving rollers, which may be connected to a torqueing device such as a motor, to transfer the torque or force onto the web to move the web with a certain speed over the cylinder. The rollers may further include a tension control system to monitor and control the tension of the web. Sensors may be used to measure the web tension. Further, the tension of the web may be controlled by either speeding up or slowing down two rollers (using driven rollers or breaks) or by directly applying a tensile force with a mechanism such as a dancer. A further roller 604 may be configured apply the web onto the central roller such that it will follow a helical path. To that end, the substrate guiding structure will feed the web onto the central cylinder at a certain feed angle. This angle may be defined by the angle between the longitudinal axis of the web and the longitudinal axis of the central cylinder.

Figures 7A, 7B:
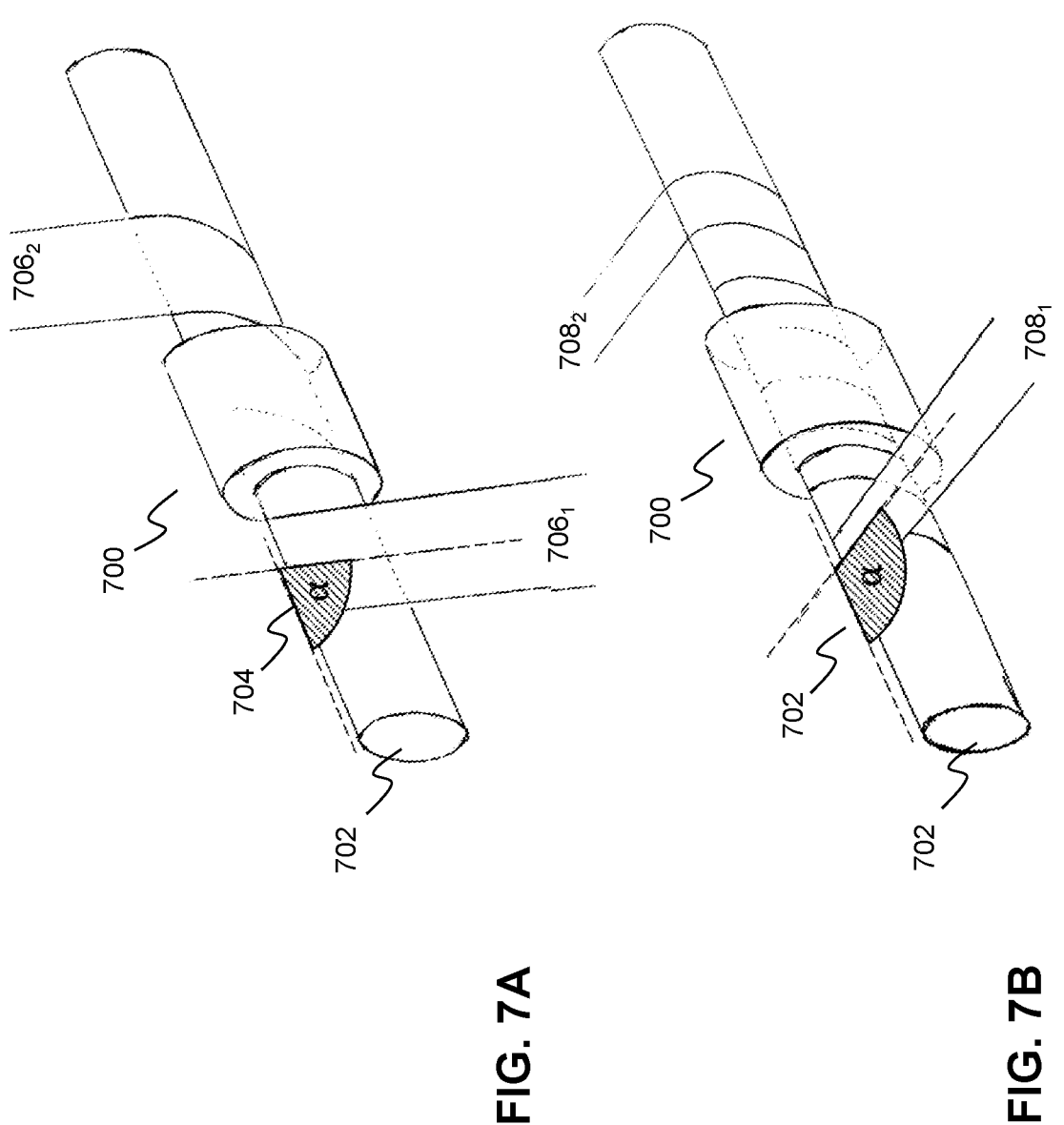
FIG. 7A and 7B illustrates the effect of the feed angle of a substrate guiding structure according to an embodiment of the invention.

FIG. 7A and 7B depicts a substrate guiding structure according to an embodiment of the invention. In particular, these figures described a substrate guiding structure wherein the position of the substrate guiding structure relative to the static central cylinder can be varied to change the feed angle of the web. As shown in the FIG. 7A, a small feed angle may be used to guide a web of a relatively large width onto the central cylinder in a helical manner. Increasing the feed angle may allow transport of webs of smaller widths. This functionality allows the substrate transport system to be used for webs of different sizes.

Figures 8, 9:
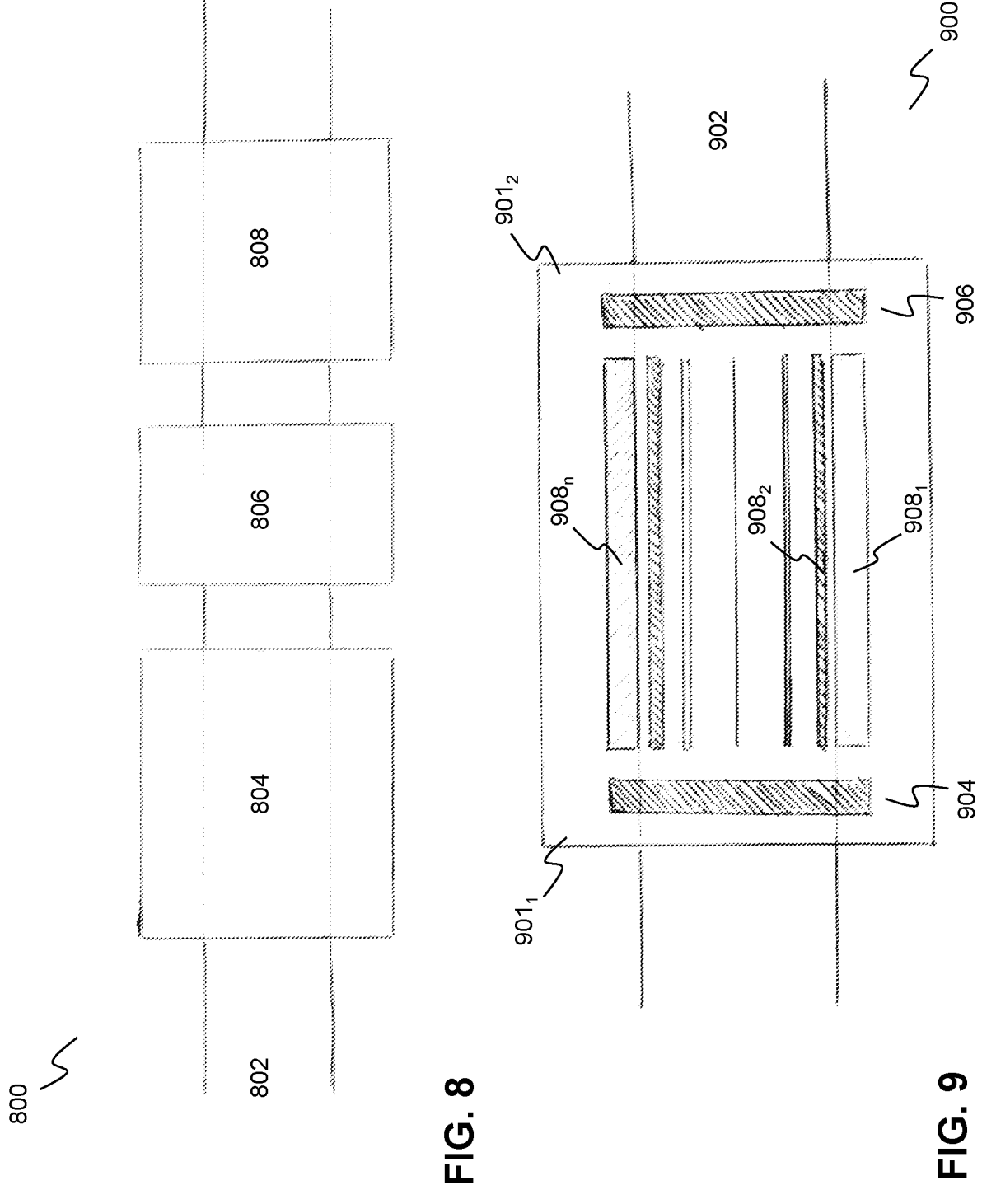
FIG. 8 depicts a schematic of a roll-to-roll layer deposition system according to a further embodiment of the invention.
FIG. 9 depicts a schematic of a deposition head for a roll-to-roll layer deposition system according to an embodiment of the invention.

This way, a single substrate transportation system may be used for a variety of web widths. Through adjusting the angle at which the web enters the central (transport) cylinder, the system will be able to process a large range of web size, limited by the diameter of the central cylinder. The web width may be more than twice the diameter of the central cylinder before the feed angle needs to be more than 45 degrees. This embodiment has the advantage, especially in a research and development situation, that one system may be used to process a variety of substrate widths. By adjusting the angle at which the substrate enters the central cylinder, the pitch of the first helical path can be chosen to match the substrate width FIG. 8 depicts a schematic of a roll-to-roll processing deposition system according to an embodiment of the invention. In particular, this figure regards a side view of a roll-to-roll processing system similar to FIG. 1C. In this case however, the central cylinder 802 may form a substrate transportation system for a plurality of different processing heads 804,806, 808. Hence, a web may be transported in a helical way along the central cylinder based on any of the embodiments described in this disclosure. Hence, transporting the web along the central cylinder along a helical path in combination with a cylindrical processing head rotating around the central cylinder allows the use of multiple processing heads, e.g. deposition heads, wherein each processing head may be configured for processing the web, e.g. depositing one or more layers of a particular composition and/or according to a particular chemical reaction onto the web. This way, multi-layer structures may be formed onto the web in an efficient way.

FIG. 9 depicts a schematic of a roll-to-roll processing system according to an embodiment of the invention. In particular, this figure depicts a cross-sectional view of roll-to-roll processing system 900 comprising a processing head, e.g. a deposition head, having a first side 901₁ and second side 901₂ arranged around a central cylinder 902. The inner surface of the processing head may comprise different processing structures 908₁₋ₙ, e.g. deposition structures, arranged in a direction parallel to the longitudinal axis of the central cylinder, which may be separated by the buffer zones (as e.g. described with reference to FIGS. 2 and 4). These processing structures may be referred to as longitudinal processing structures. As shown in the figure, the deposition head may further comprise processing structures 904,906 tangentially arranged along the inner surface of the deposition head. Structures 904 and 906 extend tangentially over the cylindrical inner surface of the deposition head, forming a complete circle. These tangential processing structures might be deposition structures, pre-treatment structures or etching structures. These deposition structures may be referred to as tangential processing structures. For example, a first tangential processing structure may be arranged at the first side of the processing head and a second tangential processing structure may be arranged at the second side of the processing head. In an embodiment, the longitudinal processing structures may be positioned between two tangential processing structures (as e.g. shown in the figure). Hence, this embodiment allows, for example, selection of a precursor that may be used to start or finish a deposition sequence, such as an ALD deposition sequence. In known spatial ALD processes, the sequence of precursors for every part of the substrate starts or finishes with another (random) one of the precursors. In contrast, the invention allows selection of a predetermined precursor for starting or finishing the process, thus adding new deposition possibilities to existing processes. For example, in some deposition schemes, it may be desired to start the deposition process always with a metal precursor (as opposed to an oxidizer) to ensure homogeneous nucleation of the ALD growth on the substrate (for instance always start aluminiumoxide growth with a trimethylaluminium exposure). In other deposition schemes, it might be beneficial to be able to choose a finishing precursor (for instance passivate an organic layer which is unstable in the environment, deposited through molecular layer deposition by always finishing with a metal precursor, or even a sequence of cycles to cap it with a thin inorganic layer.

Figures 10A, 10B:
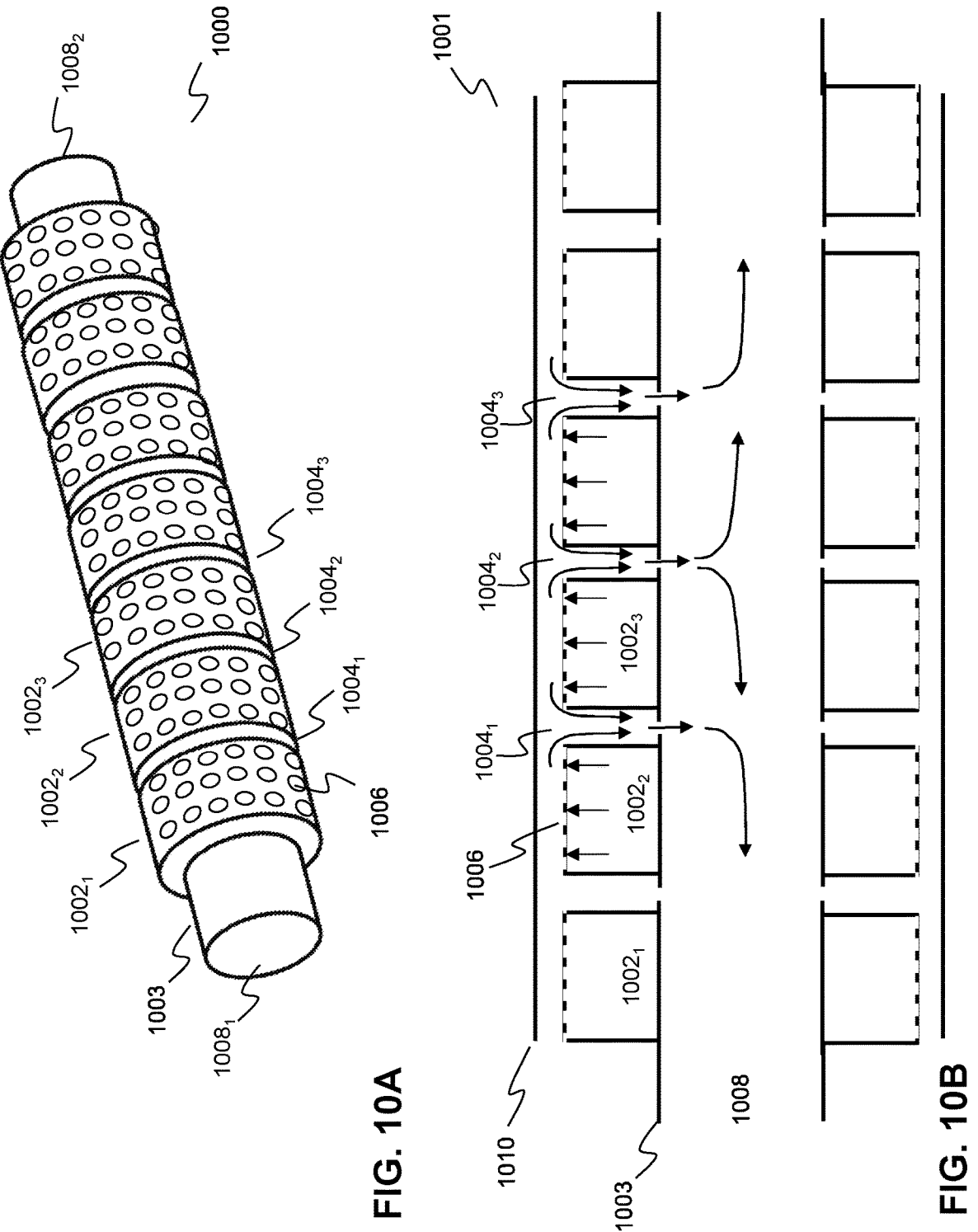
FIG. 10A and 10B depict a schematic of a substrate transportation system for roll-to-roll deposition according to an embodiment of the invention.

FIG. 10A and 10B depict a schematic of a substrate transportation system for roll-to-roll deposition according to an embodiment of the invention. In particular, these figures illustrate a non-limiting example of a central transport cylinder comprising gas bearing structures in and/or on its surface. FIG. 10A depicts a 3D schematic of a central transport cylinder 1000 comprising gas bearing structures and FIG. 10B depicts a cross-section 1001 of such central transport cylinder, including a hollow (inner) cylinder 1003 and a plurality of hollow toroidal elements 1002 13 that have a rectangular cross section and an inner diameter that matches the outer diameter of the hollow cylinder so that they can be arranged over the hollow cylinder to collectively form a gas bearing surface for a web 1010. To that end, each toroidal element may be connected via piping to a gas source (not shown) and each toroidal element may include gas outlets 1006 in its outer surface to form a gas bearing surface. Further, spacings 1004₁₋₃ between each toroidal element may function as gas exhausts, wherein at the position of each spacing one or more openings are present that provide a gas exhaust structure wherein gas that exits the gas outlets 1006 and forms a gas bearing for the web 1010 may exit via the gas outlets 1004₁₋₃. This way, the hollow (inner) cylinder may function as a central gas exhaust for the gas that is used for the gas bearing. A predetermined combination air bearing surface and exhausts may be selected to provide stable radial positioning of the web over the surface of the central cylinder.

The terminology used herein is for the purpose of describing particular embodiments only and is not intended to be limiting the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements as specifically claimed. The description of the present invention has been presented for the purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A system for roll-to-roll deposition comprising:
    a substrate transport system comprising a static elongated central cylinder for helical transport of a flexible substrate, the flexible substrate being arranged in a helical manner around the central cylinder, the central cylinder comprising bearing structures arranged in or arranged on a surface of the central cylinder for frictionless or low-friction transport of the flexible substrate over the surface of the central cylinder; and,
    one or more processing heads, each processing head being configured as a hollow cylinder, the one or more processing heads comprising at least one deposition head, an inner surface of the at least one deposition head including atomic layer deposition structures for depositing atomic layers onto the flexible substrate;
    wherein an inner radius of the one or more processing heads is larger than an outer radius of the central cylinder, the one or more processing heads being configured to rotate around the central cylinder, and wherein a longitudinal axis of a processing head coincides with the longitudinal axis of the central cylinder.

2. The system according to claim 1, wherein the helical transport of the flexible substrate is associated with a first rotation direction and a rotation of the at least one deposition head is associated with a second rotation direction, the second rotation direction being opposite to the first rotation direction.

3. The system according to claim 1, wherein the bearing structures comprise gas bearing structures and/or roller bearing structures, arranged in or on the surface of the central cylinder, wherein gas bearing structures includes a plurality of gas outlets and a plurality of gas exhausts in the surface of the central cylinder.

4. The system according to claim 1, wherein the substrate transport system further includes:
    a plurality of hollow tube segments arranged next to each other over the central cylinder, the flexible substrate being wrapped around the hollow tube segments, wherein when the flexible substrate is transported through a processing chamber, the hollow tube segments move over the central cylinder from a first end of the central cylinder towards a second end of the central cylinder.

5. The system according to claim 1, wherein the substrate transport system further includes:
    a flexible belt configured to move around the central cylinder via a second helical path, the flexible belt forming a helical belt transport structure for the flexible substrate, the flexible substrate being wrapped around the helical belt transport structure,
    wherein when the flexible belt is transported over the central cylinder via the second helical path, the flexible substrate is transported via a first helical path through the at least one deposition head.

6. The system according to claim 1, wherein the substrate transport system further comprises:
    a substrate guiding structure for guiding the flexible substrate onto the central cylinder, the substrate guiding structure being arranged so that the flexible substrate follows a first helical path around the central cylinder, the substrate guiding structure comprising one or more rollers.

7. The system according to claim 6, wherein the flexible substrate is fed onto the central cylinder at a certain feed angle and wherein the substrate guiding structure is an adjustable substrate guiding structure configured for adjusting a position and/or orientation of the flexible substrate relative to the central cylinder, the certain feed angle being defined by an angle between the longitudinal axis of the flexible substrate and the longitudinal axis of the central cylinder.

8. The system according to claim 1, wherein the atomic layer deposition structures are radially arranged around the central cylinder and divided in a plurality of processing sections.

9. The system according to claim 8, wherein processing sections are separated by buffer sections.

10. The system according to claim 1, wherein the one or more processing heads further include processing structures for processing the flexible substrate, wherein the processing structures are radially arranged along the inner surface of a processing head.

11. The system according to claim 1, wherein the one or more processing heads further includes processing structures, wherein the processing structures are tangentially arranged along the inner surface of a processing head.

12. The system according to claim 1, wherein one or more gas supplies and/or exhausts are connected to the at least one deposition head using one or more rotary unions.

13. The system according to claim 1, wherein a space between the surface of the central cylinder and the inner surface of the at least one deposition head form deposition zones for depositing atomic layers onto the flexible substrate while the flexible substrate is transported via a first helical path around the central cylinder through the deposition head.

14. The system according to claim 12, wherein the one or more rotary unions comprise one or more hollow shaft rotary unions positioned on one or both sides of the at least one deposition head.

15. The system according to claim 9, wherein the buffer sections are purging sections.

16. The system according to claim 8, wherein at least part of the plurality of processing sections extend in a direction parallel to the longitudinal axis of the central cylinder in the inner surface of the at least one deposition head.

17. The system according to claim 5, wherein the flexible belt is an endless conveyer belt.

18. The system according to claim 6, wherein the one or more rollers include one or more first rollers each configured as a driving roller operably connected to a torquing device to transfer a torque or force onto the flexible substrate to move the flexible substrate over the central cylinder.

19. The system according to claim 1, wherein the one or more processing heads further comprise at least one pre-treatment head having an inner surface including pre-treatment structures or an etching head having an inner surface including etching structures.

* * * * *